United States Patent
Park et al.

(10) Patent No.: US 8,013,357 B2
(45) Date of Patent: Sep. 6, 2011

(54) SIDE VIEW LIGHT EMITTING DIODE PACKAGE

(75) Inventors: Kyoung-Il Park, Osan-si (KR); Jin-Won Lee, Yongin-si (KR); Sun-Hong Kim, Incheon (KR); Min-Sik Kim, Seoul (KR); Ji-Na Lee, Siheung-si (KR)

(73) Assignee: Alti-Electronics Co., Ltd (KR)

( * ) Notice: Subject to any disclaimer, the term of this patent is extended or adjusted under 35 U.S.C. 154(b) by 0 days.

(21) Appl. No.: 12/495,854

(22) Filed: Jul. 1, 2009

(65) Prior Publication Data

US 2010/0001308 A1 Jan. 7, 2010

(30) Foreign Application Priority Data

Jul. 1, 2008 (KR) .......................... 10-2008-0063509

(51) Int. Cl.
*H01L 33/62* (2010.01)
*H01L 33/64* (2010.01)

(52) U.S. Cl. ........... 257/99; 257/E33.058; 257/E33.066; 257/E33.075

(58) Field of Classification Search ................ 257/99, 257/E33.056, E33.058, E33.066, E33.075
See application file for complete search history.

(56) References Cited

U.S. PATENT DOCUMENTS

| 6,953,952 | B2 * | 10/2005 | Asakawa | 257/103 |
| 7,566,159 | B2 * | 7/2009 | Oon et al. | 362/612 |
| 2007/0247841 | A1 * | 10/2007 | Kono et al. | 362/227 |
| 2008/0048201 | A1 * | 2/2008 | Kim et al. | 257/98 |

* cited by examiner

*Primary Examiner* — Benjamin P Sandvik
*Assistant Examiner* — W. Wendy Kuo
(74) *Attorney, Agent, or Firm* — The Farrell Law Firm, P.C.

(57) ABSTRACT

Provided is a side view light emitting diode package including a housing that includes a front side part and a rear side part integrally formed with the front side part, the front side part having a light emission part; and a lead frame that is located between the front side part and the rear side part, wherein the lead frame includes a first lead connected to a first electrode of a Light Emitting Diode (LED) chip and a second lead connected to a second electrode of the LED chip, wherein the front side part includes a first groove, a second groove, and a third groove, wherein the first lead and the second lead are extended through the first groove and the second groove, respectively, and a heat dissipation part is extended from the first lead through the third groove to an outside of the LED package.

3 Claims, 7 Drawing Sheets

SIDE VIEW LIGHT EMITTING DIODE PACKAGE

PRIORITY

This application claims priority from and the benefit of Korean Patent Application No. 10-2008-0063509, filed on Jul. 1, 2008, the contents of which are incorporated herein by reference for all purposes as if fully set forth herein.

BACKGROUND OF THE INVENTION

1. Field of the Invention

This document is directed to a light emitting diode (LED) technology and particularly to a side view LED package.

2. Description of the Related Art

Light emitting diodes (hereinafter referred to as "LED") are semiconductor elements that emit non-conformity, narrow band light beams when being applied with a forward bias voltage. LEDs have been widely employed as a display for small electronics and the applicable areas are increased more and more.

In general, an LED is used together with other several components, i.e. in the form of an LED package. LED packages may be classified into top view types and side view types according to the use. Side view types of LED packages are typically used for a backlight of a portable device such as laptop computers or cell phones.

An LED package includes a housing and a lead frame. The housing may include a front side part and a rear side part. The lead frame is located between the front side part and the rear side part. An LED chip is placed on a pad of the lead frame and receives electricity from an external power supply to emit light.

A cavity is formed in the center of the front side part of the housing. The light generated from the LED chip is externally radiated through the cavity.

In the meanwhile, a lot of heat is generated from the LED chip while electricity is supplied to the LED chip to generate light. Generated heat may damage the LED chip, lowers the luminance efficiency, as well as reduces life span of the LED chip.

Accordingly, there is a need of externally dissipating heat generated from an LED chip in a LED package.

SUMMARY OF THE INVENTION

According to an exemplary embodiment, there is provided a side view light emitting diode package including a housing that includes a front side part and a rear side part integrally formed with the front side part, the front side part having a light emission part; and a lead frame that is located between the front side part and the rear side part, wherein the lead frame includes a first lead connected to a first electrode of an LED chip and a second lead connected to a second electrode of the LED chip, wherein the front side part includes a first groove, a second groove, and a third groove, wherein the first lead and the second lead are extended through the first groove and the second groove, respectively, and a heat dissipation part is extended from the first lead through the third groove to an outside of the LED package.

The third groove may be located at a middle and upper part of a rear surface of the front side part, and the first and second grooves may be located at a left and lower part and a right and lower part, respectively, of the rear surface of the rear side part.

A height of the middle and upper part of the rear surface may be lower than a height of both ends of the rear side part so that a space is formed at the middle and upper part of the rear side part, wherein the heat dissipation part may be extended from a first section of the first lead through the third groove in a direction of a z axis and then extended in a direction of an −x axis within the space.

A part of the heat dissipation part, which is extended to an outside of the LED package, may be formed to cover a top surface of the housing.

The front side part may further include a protrusion that externally protrudes from a front surface.

The present embodiment may effectively dissipate heat generated from the LED chip by extending a heat dissipation part from the lead frame in the LED package to the outside of the LED package.

BRIEF DESCRIPTION OF THE DRAWINGS

The above and other features of the present disclosure will be described in reference to certain exemplary embodiments thereof with reference to the attached drawings in which.

DETAILED DESCRIPTION OF THE EXEMPLARY EMBODIMENTS

Figure 1:
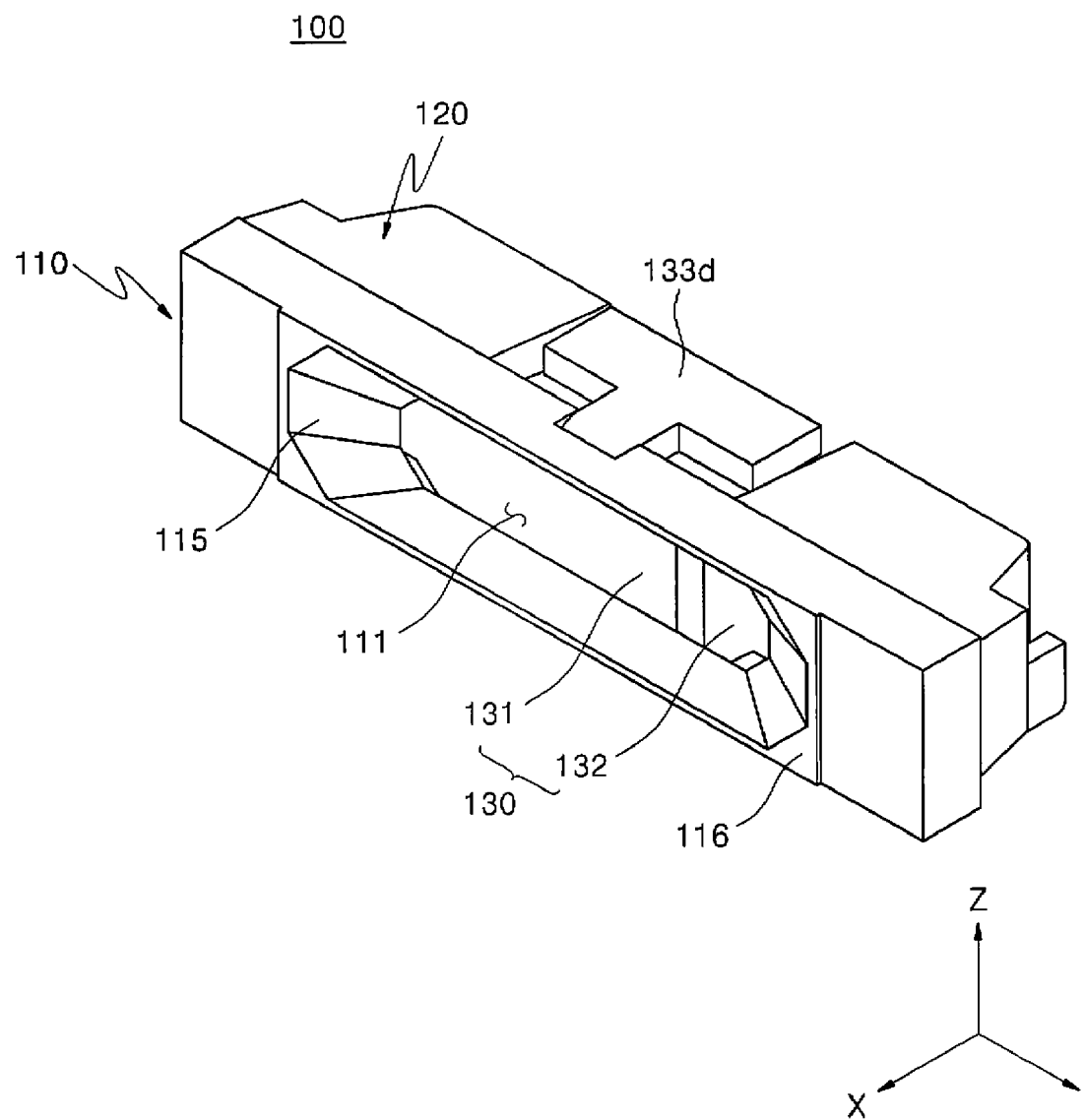
FIG. 1 is a perspective view illustrating a 100 according to an exemplary embodiment of the present invention.

Reference will now be made in detail to exemplary embodiments, examples of which are illustrated in the accompanying drawings, wherein like reference numerals refer to the like elements throughout. The embodiments are described below in order to explain the present disclosure by referring to the figures.

Throughout the specification, the terms "front side" and "front surface" are used to refer to a part of the LED package viewed in the direction of −x axis, the terms "rear side" and "rear surface" in the direction of x axis, the terms "left side" and "right side" in the direction of y axis and −y axis, respectively.

Figure 2:
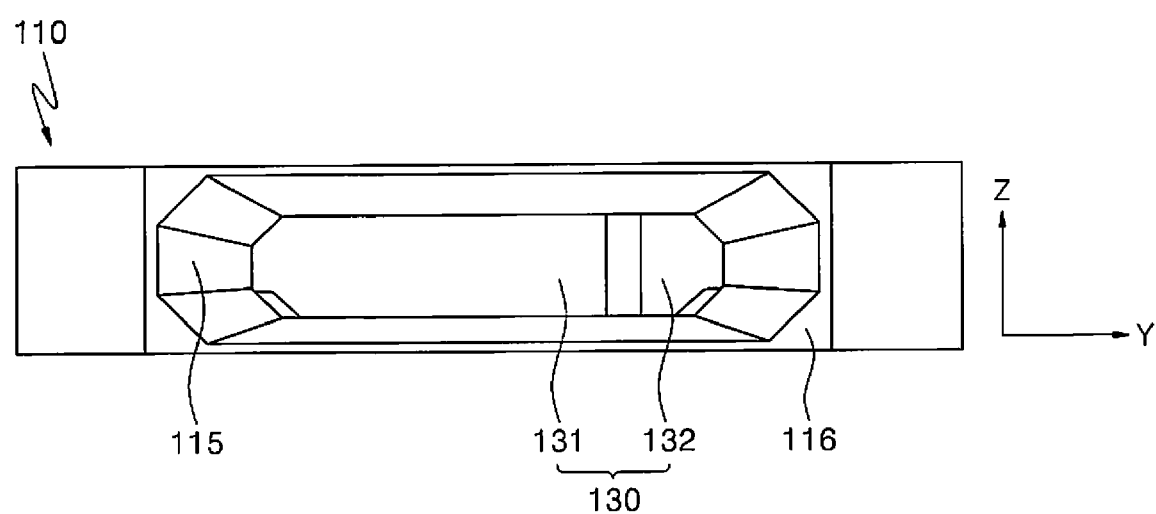
FIG. 2 is a front view illustrating the LED package 100 shown in FIG. 1.

FIG. 1 is a perspective view illustrating an LED package 100 according to an exemplary embodiment and FIG. 2 is a front view illustrating the LED package 100 shown in FIG. 1.

Referring to FIGS. 1 and 2, the LED package 100 includes a housing and a lead frame 130. The housing includes a first side part 110 and a rear side part 120 that are integrally formed to each other. The lead frame 130 is arranged between the first side part 110 and the rear side part 120.

The first side part 110 has a cavity 111 through which the lead frame 130 is externally exposed. A resin transmitting a specific wavelength of light is filled in the cavity 111, thus constituting a light emitting window. An LED chip (not shown) is arranged on a pad of the lead frame 130 and exposed to the external through the light emitting window.

The resin may contain a phosphor that absorbs a certain wavelength of light to radiate another wavelength of light.

An inner wall surrounds the cavity 111 and may be inclined by a predetermined angle with respect to a central axis of the LED package 100 which is parallel with x axis. That is, the distance between the central axis and the inner wall 115 may decrease as going to the direction of −x axis.

The structure thusly designed allows light emitted from the LED chip (not shown) to be effectively reflected to the outside, thus improving luminance efficiency of the LED package 100.

The inner wall 115 may include total eight sub-surfaces, each shaped as a trapezoid. Upper sub-surfaces located at the upper side and lower sub-surfaces located at the lower side are symmetrical to each other with respect to a central axis parallel with y axis, and three left sub-surfaces located at the left side respectively are symmetrical to three right sub-surfaces located at the right side respectively with respect to a central axis parallel with z axis.

A protrusion 116 may be protruded from a front surface of the first side part 110. When a resin is filled in the cavity 111 the protrusion 116 may prevent the resin from overflowing out of the cavity 111.

A bottom surface of the first side part 110 is mounted on a circuit board (not shown) such as a printed circuit board. The lead frame 130 includes a first lead 131 and a second lead 132 that are connected to the anode and the cathode, respectively, of the LED chip (not shown). A heat dissipation part 133*d* may be extended from the first lead 131. The lead frame 130 will be described in more detail with reference to FIGS. 5 and 6.

Figure 3:
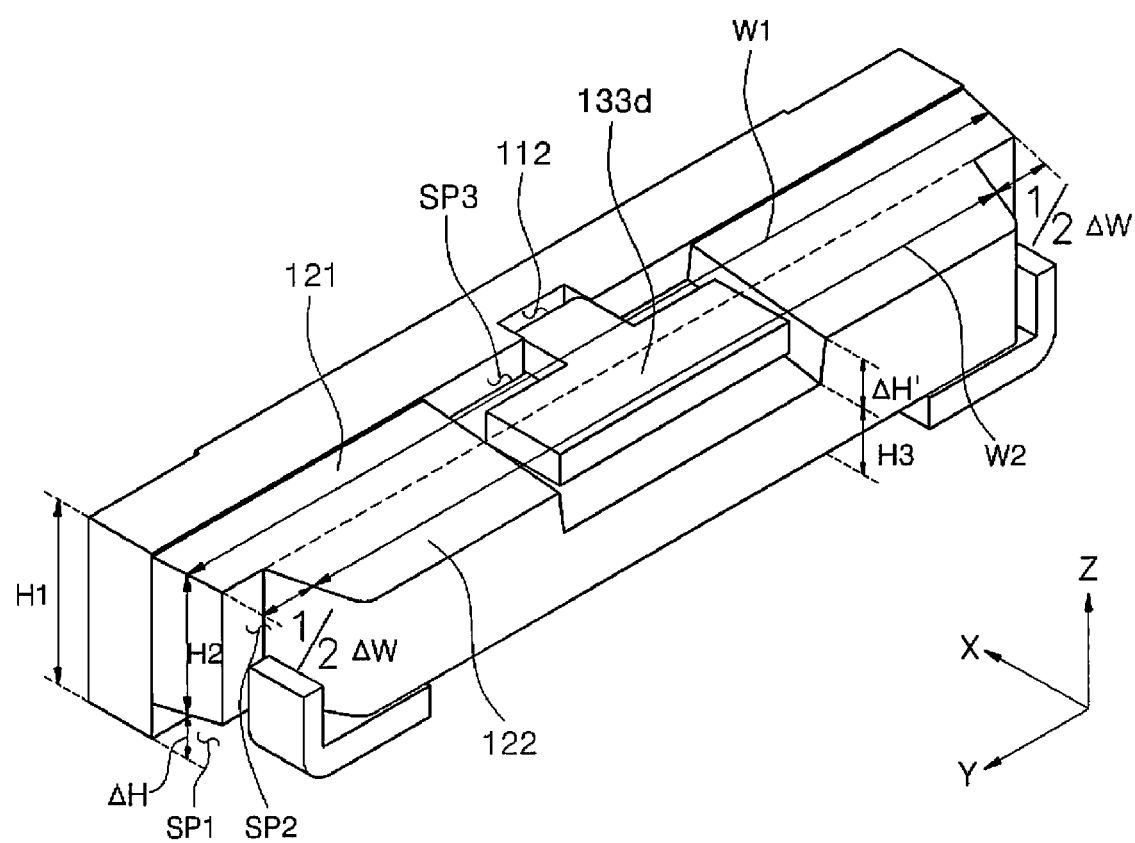
FIG. 3 is a rear perspective view illustrating the LED package 100 shown in FIG. 1.
Figure 4:
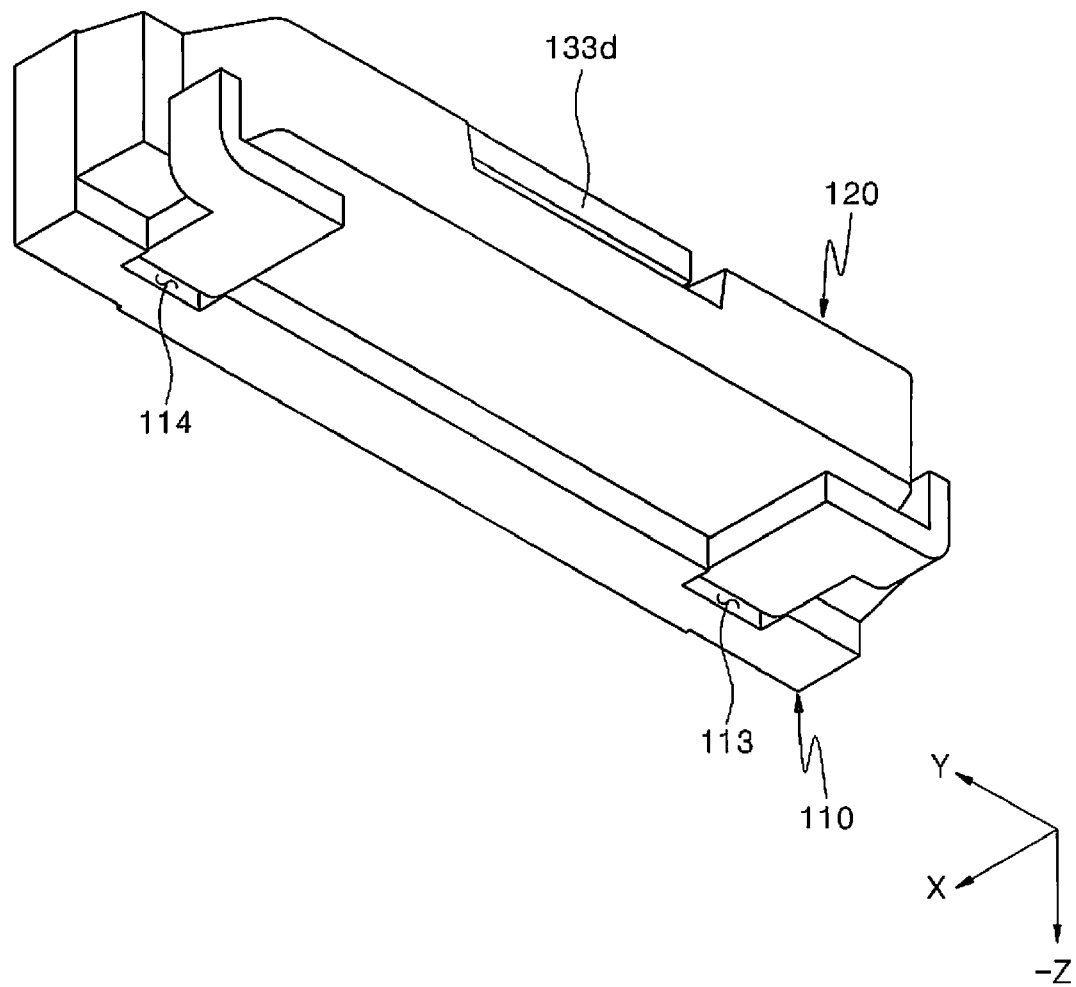
FIG. 4 is a bottom perspective view illustrating the LED package 100 shown in FIG. 1.
Figure 5:
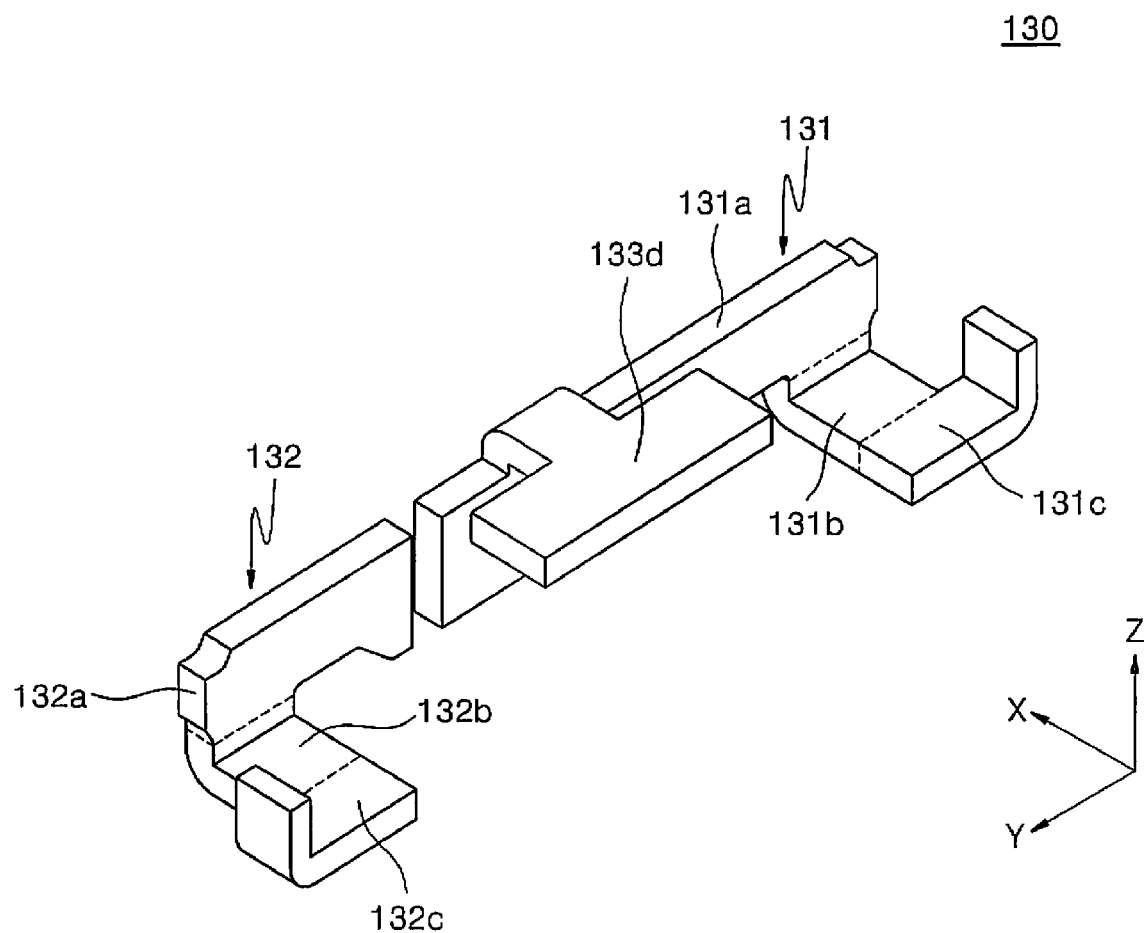
FIG. 5 is a perspective view illustrating an exemplary lead frame 130 included in the LED package 100 shown in FIG. 1.
Figure 6:
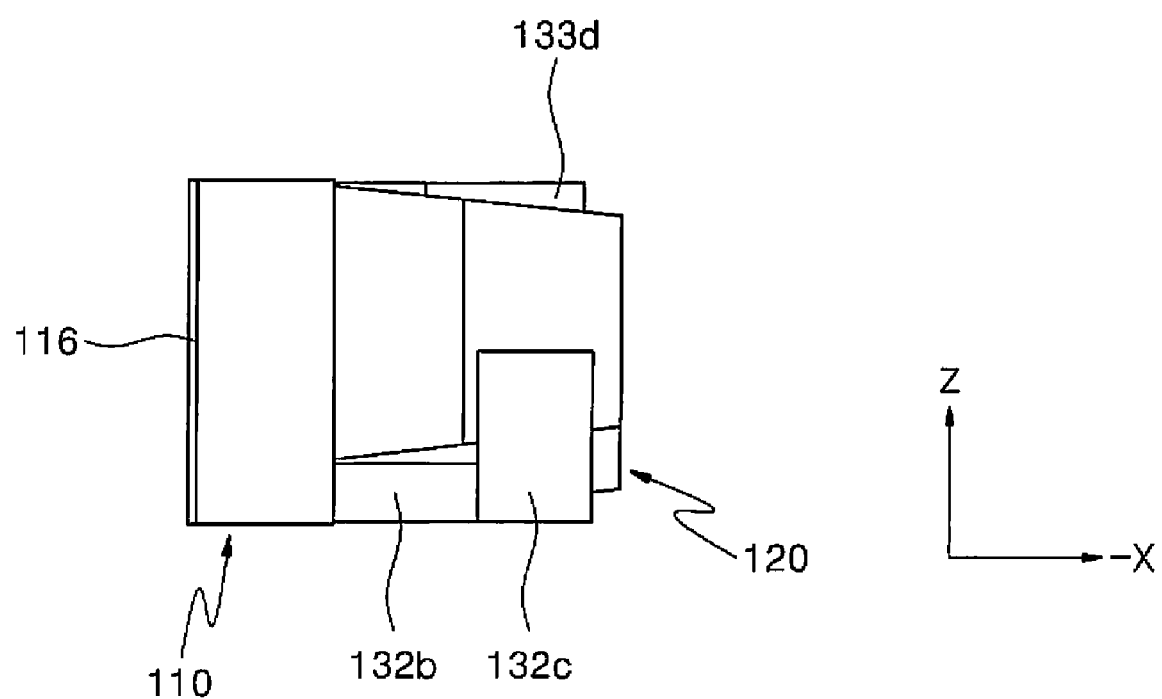
FIG. 6 is a right side view illustrating the LED package 100 shown in FIG. 1.

FIG. 3 is a rear perspective view illustrating the LED package 100 shown in FIG. 1, FIG. 4 is a bottom perspective view illustrating the LED package 100 shown in FIG. 1, FIG. 5 is a perspective view illustrating an exemplary lead frame 130 included in the LED package 100 shown in FIG. 1, and FIG. 6 is a right side view illustrating the LED package 100 shown in FIG. 1.

Referring to FIGS. 3 and 4, a middle and upper part, a left and lower part, and a right and lower part of the rear surface of the first side part 110 include a first groove 113, a second groove 114, and a third groove 112, respectively. The lead frame 130 may be extended through the grooves as described later.

A height H2 of the rear side part 120 at both ends thereof is lower than a height H1 of the first side part 110 at both ends thereof by a difference in height Δ H. That is, the rear side part 120 is depressed at both ends from a bottom surface of the first side part 110 in the direction of z axis as much as the difference in height Δ H. The difference in height Δ H yields a first space SP1. The rear side part 120 includes a front side sub part 121 and a rear side sub part 122. A width W2 of the rear side sub part 122 is narrower than a width W1 of the front side sub part 121 by a difference in width Δ W. That is, the rear side sub part 122 is depressed from a left surface of the front side sub part 121 as much as ½ difference in width Δ W in the direction of y axis and from a right surface of the front side sub part 121 as much as ½ difference in width Δ W in the direction of −y axis. The difference in height Δ W yields a second space SP2.

A height H3 of the rear side part 120 at a middle part is lower than the height H2 of the rear side sub part 122 by a difference in height Δ H'. That is, the rear side part 120 is depressed at its middle part from a top surface of the rear side sub part 122 as much as the difference in height ΔH' in the direction of −z axis. Due to the difference in height Δ H', a third space SP3 is formed.

Referring to FIGS. 5 and 6, the lead frame 130 includes a first lead 131 and a second lead 132. An LED chip (not shown) may be arranged on the first lead 131. The anode of the LED chip is connected to the first lead 131 and the cathode is connected to the second lead 132.

The first lead 131 includes a first section 131*a*, a second section 131*b*, and a third section 131*c*, and the second lead 132 includes a fourth section 132*a*, a fifth section 132*b*, and a sixth section 132*c*. The first lead 131 may further include a heat dissipation part 133*d* for externally dissipating heat generated from an LED chip (not shown).

Returning to FIG. 1, a part of the first section 131*a* is exposed to the external through the cavity 111 and the other parts of the first section 131*a* are covered by the first side part 110 thus not to be viewed from the outside.

Similarly, a part of the fourth section 132*a* is exposed to the external through the cavity 111 and the other parts of the fourth section 132*a* are covered by the first side part 110 thus not to be viewed from the outside.

The second section 131*b* is extended from the first section 131*a* through the first groove 113 in the direction of −z axis and then further extended in the direction of −x axis within the SP1. In this case, the second section 131*b* may be accommodated in the SP1 not to be viewed as the LED package 100 is seen from the front surface. Accordingly, the area of the first side part 110 may be increased as much as the space conventionally occupied by the second section 131*b* in the LED package 100 of a limited height, that is, the area of the cavity 111 may be broadened, thus making it possible to increase the amount of light emitted from the LED chip.

Similarly, the fifth section 132*b* is extended from the fourth section 132*a* through the second groove 114 in the direction of −z axis and then further extended in the direction of −x axis within the SP1. In this case, the fifth section 132*b* may be accommodated in the SP1 not to be viewed as the LED package 100 is seen from the front surface.

Accordingly, the area of the first side part 110 may be increased as much as the space conventionally occupied by the fifth section 132*b* in the LED package 100 of a limited height, that is, the area of the cavity 111 may be broadened, thus making it possible to increase the amount of light emitted from the LED chip.

The third section 131*c* is extended from the second section 131*b* in the direction of −y axis within the SP1 and then further extended in the direction of z axis within the SP2. In this case, the third section 131*c* may be accommodated in the SP2 not to be viewed as the LED package 100 is seen from the front surface. Accordingly, the area of the first side part 110 may be increased as much as the space conventionally occupied by the third section 131*c* in the LED package 100 of a limited height, that is, the area of the cavity 111 may be broadened, thus making it possible to increase the amount of light emitted from the LED chip.

Similarly, the sixth section 132*c* is extended from the fifth section 132*b* in the direction of y axis within the SP1 and then further extended in the direction of z axis within the SP2. In this case, the sixth section 132*c* may be accommodated in the SP2 not to be viewed as the LED package 100 is seen from the front surface. Accordingly, the area of the first side part 110 may be increased as much as the space conventionally occupied by the sixth section 132*c* in the LED package 100 of a limited height, that is, the area of the cavity 111 may be broadened, thus making it possible to increase the amount of light emitted from the LED chip.

The second section 131*b* and the third section 131*c* of the first lead 131, which are exposed to the outside of the first side part 110, and the fifth section 132*b* and the sixth section 132*c* of the second lead 132, which are exposed to the outside of the first side part 110, may be supplied with electricity from an external power supply (not shown) and dissipate heat generated from the LED chip to the exterior.

The heat dissipation part 133d is extended from the first section 131a through the third groove 112 in the direction of z axis and then further extended in the direction of −x axis within the SP3. In this case, the heat dissipation part 133d may be accommodated in the SP3 as shown in FIG. 3 not to be viewed as the LED package 100 is seen from the front surface as shown in FIG. 2.

Accordingly, the area of the first side part 110 may be increased as much as the space conventionally occupied by the heat dissipation part 133d in the LED package 100 of a limited height, that is, the area of the cavity 111 may be broadened, thus making it possible to increase the amount of light emitted from the LED chip.

Then, the heat dissipation part 133d may be extended in both directions of y axis and −y axis to be shaped as the letter "T" as seen from the top surface. Although it has been described in this exemplary embodiment that the heat dissipation part 133d is shaped as the letter "T" as seen from the top surface, the present embodiment is not limited thereto. For example, the heat dissipation part 133d may be formed in various shapes, such as a dash, a cross "+", a circle, a triangle, a rectangle, etc.

As described above, the exemplary embodiment may effectively dissipate heat generated from the LED chip (not shown) through the heat dissipation part 133d that is externally extended from the first section 131a to the outside of the LED package 100.

Figure 7:
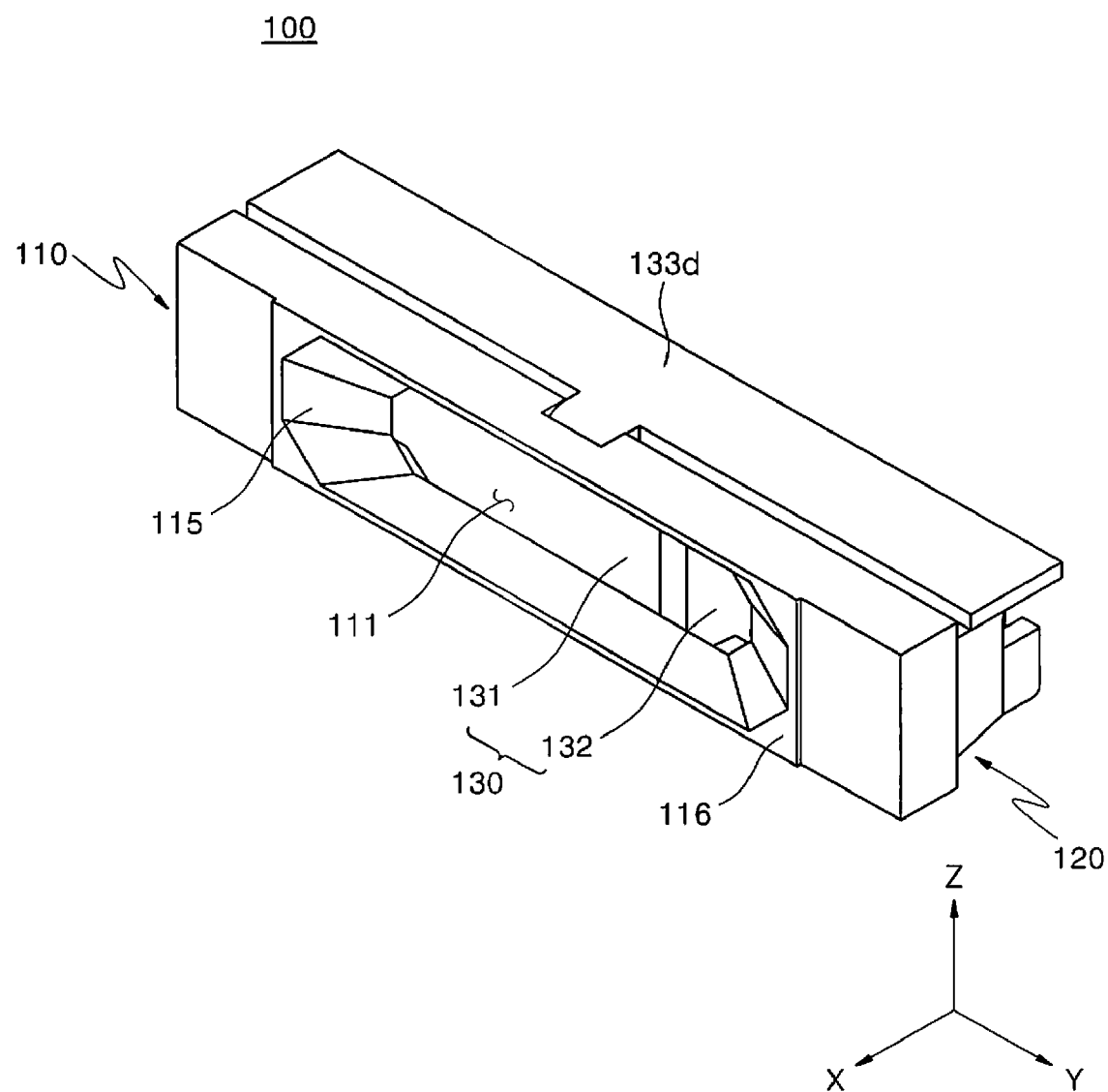
FIG. 7 is a perspective view illustrating an LED package according to another exemplary embodiment.

FIG. 7 is a perspective view illustrating an LED package according to another exemplary embodiment.

The heat dissipation part 133d may be formed to cover the top surface of the housing as broad as possible in order to increase the area of heat dissipation. As shown in FIG. 7, the heat dissipation part 133d may be formed so that the area of the heat dissipation part 133d covering the top surface of the housing is equal to that of the top surface of the housing for the simplicity of manufacturing the heat dissipation part 133d and mounting the same on the substrate.

Although the present disclosure has been described with reference to certain exemplary embodiments thereof, it will be understood by those skilled in the art that a variety of modifications and variations may be made to the present disclosure without departing from the spirit or scope of the present disclosure defined in the appended claims, and their equivalents.

What is claimed is:

1. A side view Light Emitting Diode (LED) package comprising:
    a housing that includes a front side part and a rear side part integrally formed with the front side part, the front side part having a light emission part; and
    a lead frame that is located between the front side part and the rear side part,
    wherein the lead frame includes a first lead connected to a first electrode of an LED chip and a second lead connected to a second electrode of the LED chip,
    wherein the front side part includes a first groove, a second groove, and a third groove, wherein the first lead and the second lead are extended through the first groove and the second groove, respectively, and a heat dissipation part is extended from the first lead through the third groove to an outside of the LED package,
    wherein the third groove is located at a middle and upper part of a rear surface of the front side part, and the first and second grooves are located at a left and lower part and a right and lower part, respectively, of a rear surface of the front side part, and
    wherein the heat dissipation part is extended from the first lead through the third groove in a direction of a z axis and then extended in a direction of an −x axis and then extended in both directions of a y axis and a −y axis to cover a top surface of the housing.

2. The side view light emitting diode package of claim 1, wherein a height of the middle and upper part of the rear surface is lower than a height of both ends of the rear side part so that a space is formed at the middle and upper part of the rear side part.

3. The side view light emitting diode package of claim 1, wherein the front side part further includes a protrusion that externally protrudes from a front surface.

* * * * *